(12) United States Patent
Gurovich

(10) Patent No.: US 7,139,009 B2
(45) Date of Patent: Nov. 21, 2006

(54) ION PRINTER

(75) Inventor: Boris Aronovich Gurovich, Moscow (RU)

(73) Assignees: Vladimir Borisovich Betelin, Moscow (RU); Alexandr Ilyich Stavitsky, Moscow (RU)

( * ) Notice: Subject to any disclaimer, the term of this patent is extended or adjusted under 35 U.S.C. 154(b) by 183 days.

(21) Appl. No.: 10/979,595

(22) Filed: Nov. 2, 2004

(65) Prior Publication Data

US 2005/0104014 A1 May 19, 2005

(30) Foreign Application Priority Data

Nov. 4, 2003 (RU) ............................. 2003132108

(51) Int. Cl.
- *B41J 2/415* (2006.01)
- *G03F 7/00* (2006.01)
- *G03F 7/20* (2006.01)
- *G03F 7/213* (2006.01)
- *H01J 37/08* (2006.01)

(52) U.S. Cl. .............. 347/121; 250/492.21; 250/492.3; 313/359.1; 313/360.1

(58) Field of Classification Search ................ 347/120, 347/121, 123; 250/492.21, 492.3, 492.1, 250/492; 430/31, 53, 269, 296; 313/359.1, 313/360.1

See application file for complete search history.

(56) References Cited

U.S. PATENT DOCUMENTS 4,088,891 A    5/1978   Smith et al.
4,875,062 A   10/1989   Rakov
5,504,340 A *  4/1996   Mizumura et al. ..... 250/492.21

* cited by examiner

*Primary Examiner*—Huan Tran
(74) *Attorney, Agent, or Firm*—Collard & Roe, P.C.

(57) ABSTRACT

An ion printer is proposed for simultaneous generation on the spatially fixed substrate of the whole image composed of micron and submicron size elements, containing a fixed substrate with layer of material capable of changing its properties under the ion influence; an ion source with a tool for beam forming, which ensures the divergence angle less than 20°, and with the first tool of acceleration of ions providing them the energy less than the one needed for variation of the properties of the material on the substrate surface. The said ion printer contains also a mask with parallel flat surfaces and with a ratio of its thickness to the distance from the mask to the substrate equals to 1:(0.6–3), correspondingly. The said mask has a plurality of apertures for passing the said accelerated ions, each of the apertures having the ratio of its depth to its cross-section size in the range from 9 to 50. Each of plurality of apertures contains a pair of the first electrode and the second electrode, acting as a tool of regulation of the passing of said ions to the substrate. Said ion printer has also a second tool of acceleration of said ions placed under the said substrate; an electric voltage source connected to each first electrode and to each second electrode; a plurality of controlled switchboards, each electrically connected to the said voltage source and placed between the said voltage source and each of the said second electrode for selective regulation of electric voltage in each aperture and, correspondingly, for the controlled passing of ions in each aperture to the said substrate.

9 Claims, 3 Drawing Sheets

ION PRINTER

The invitation relates to means for image generation by accelerated ions, more accurately it refers to ion printer.

FIELD OF THE INVENTION

The invitation can be used for preparation without the resist masks of the functional structures with micron and submicron size elements for various applications including the tags for goods and documents counterfeit protection.

DESCRIPTION OF THE PRIOR ART

The device is known for image generation (U.S. Pat. No. 4,088,891, Sep. 5, 1978) by ion beam formed in corona discharge, which includes the spatial modulator—apertured mask in form of metallic or insulating plate with number of apertures, their internal walls being electrically connected to one of the poles of the voltage source. At that the apertured mask (in the form of metallic plate) or metallized walls of the mask's apertures act as electrodes to accelerate the ion beam. The said device comprising a mean for image registration, placed under the said apertured mask as well as an additional electrode placed under the said mean for image registration. According to the ratio of electric potentials on apertured mask and on the additional electrode the number of ions reaching the registration mean is regulated.

A disadvantage of the known device is the fact that ion source generates a non accelerated particle beam which is accelerated by only the electrodes situated in the apertured mask or under this mask. As a result the formed accelerated charged particle beam has a large divergence angle (about 180°). In the beam transmission mode the beam travelling through the apertures in the mask changes its divergence angle only slightly if the so called aspect ratio, i.e. the ratio of the mask thickness to the aperture diameter, is $\leq 1$, at higher values of this parameter (>1) the influence of the aperture diameter on the divergence angle will be more effective. The latter is not principally important in cases of generating the macroscopic images. However the situation changes if one needs to generate the images with micron or submicron size elements.

From the simple geometric considerations (that are usually used in such calculations) it follows that if a half of divergence angle of the ion beam equals to 45° a broadening of the image of the mask aperture, generated by accelerated ions on the image registration mean equals to 2 µm for 1 µm distance between the mask and the registration mean. If this distance increases the image broadening increases proportionally.

This circumstance practically excludes application of the known device for generating images with micron and submicron elements. A serious disadvantage of this device is concerned with using electrodes for ion beam acceleration inside the apertures, which inevitably results in huge losses of ion beam current and to output decrease due to coming of the ions on these electrodes even in the transparent regime.

Besides a double-step system of ion acceleration used in this device can operate at only definite conditions. If the ion acceleration after the first step gives them energy sufficient for image generation on the registration mean this devise loses controllability. The latter is due to the fact that even at the total blocking of ion beam by regulating electrodes (and at properly selected voltage on additional electrode) the ions from the beam coming on the electrodes don't disappear but are neutrolized (transform into neutral atoms) and scatter. A noticeable part of those atoms being scattered on the electrodes would anyway come to the image registration mean in a random way (not according to ray optics laws), which results in unavoidable huge image distortion. In case of application of such device for generating the images with micron or submicron elements the mentioned drawback would lead to inevitable disagreement between the image and the aperture geometry in the mask.

For production of the images with micron or submicron element size by projection of charged particle beam through the apertures in modulator (mask) to the image registration mean the output beams living the mask should have the divergence angles of 6–10° or even less in accordance with ray optics principles. The ion source proposed in the discussed invention could provide such divergence angle only for aspect ratio of $\geq 9$, which is not envisaged in that device. In this case the images with micron or submicron elements could be obtained only for the distance between the mask and the image registration mean of $\leq 100$ µm, which is also not envisaged in the device. In case of the input beam divergence angle of 180° and the output one of 10° the ray optics laws predict the ratio of ion beam intensities at the input and at the output of the apertured mask which is proportional to the squared ratio of input and output divergence angles. Thus in the discussed device the useful intensity of the ion beam will be only $\frac{1}{324}$ of the input one when it's used for generating images with micron or submicron elements. Thus the discussed device with corona discharge ion source can't be used for generating images with micron or submicron element size due to the fact that its initial ion beam intensity should be very high (which would inevitably lead to overheating or melting the apertured mask), otherwise its output will be very low.

The ion projection print head is known (U.S. Pat. No. 4,875,062, Jan. 15, 2000) for generating images in discontinuous mode on a moving ion receptor substrate by irradiating the substrate line-by-line from substantially uniform linear ion source. The said print head includes the mask for spatial ion beam modulation in the form of dielectric plate with single elongated slot having the electrodes in its bottom side oriented in its longitudinal direction, which are connected to the voltage source. The upper side of the mask directed to ion source is metallized, the metal layer acting as electrode.

A said print head includes also a substrate for registration of the generated image placed under the mask with a facility of step-by-step movement in horizontal plane. The electrodes oriented in a longitudinal direction of the said slot accelerate the ion beam up to the energy (controlled by applied voltage) sufficient for generating on substrate of the image elements with various colour depths (e.g. from black to light grey). However, due to low ion energy in the beam formed by ion source in the known device the additional energy needed for generating of the image elements is given to ions by a voltage on the electrodes placed inside the gap of the mask. At low voltages on the electrodes a relatively high part of ion beam will pass through the gap and reach the substrate according to ray optics laws. In the known device these ions will not create a nigrescence on the substrate (or create only week one). At high voltage on the electrodes all the accelerated ions will be deflected to the electrodes, neutralized (transformed into neutral atoms) and scatter. That's why the generated image elements with high nigrescence will be formed not in accordance with ray optics laws but depending on the scattering rules, which would avoidably result in large distortions. These distortions could be acceptable for macroscopic elements of the image but not for the micron and submicron ones.

Moreover, without the substrate movement this device could generate only single linear fragment of the image. To get the whole image a discrete movement of substrate is needed and the elements matching in the previous and subsequent lines should be provided. In fact, the generation of images in only discrete mode practically excludes the application of this print head for image generation with micron and submicron elements.

Our invention is directed to generating by accelerated ions of the images on substrate with elements of micron and submicron size. Another goal of this invention is a simultaneous generation by accelerated ions of all those image elements on substrate.

SUMMARY OF THE INVENTION

The declared goals are achieved by ion printer, containing in the chamber with vacuum pumping facilities the coaxial parts: an ion beam source with a tool for beam forming; a first tool of acceleration of said ions in the said ion beam; a substrate for receiving the said accelerated ions, which has on its surface facing to said ion source a layer of material capable of changing its properties under the influence of said accelerated ions of said ion beam; a mask with parallel flat surfaces and with aperture for passing said ions to the said substrate and with a tool for the said passing regulation of the said accelerated ions to the said substrate; an electric voltage source connected to the said passing regulation tool; wherein according to invention a said tool for ion beam forming allows forming said ion beam with divergence angle $\leq 20°$, a first tool of acceleration of said ions in the said ion beam for imparting an energy to the ions, which is less than needed for variation the properties of said material on the surface of said substrate; a said substrate for receiving said accelerated ions is mounted fixed; a said mask with parallel flat surfaces has a ratio of its thickness to the distance from the said mask to the said substrate of 1/(0.6–3), correspondingly and has a plurality of said apertures with the ratio of its depth to its cross-section size being in the range from 9 to 50; a said tool for said passing regulation of said ions represents a plurality of pairs of the first electrode and the second electrode and each pair of electrodes of said plurality of pairs located in each of said plurality of said apertures; said voltage source is connected to each said first electrode and each said second electrode of each of plurality of said pairs; there is an additional second tool for acceleration of said ions placed under the said substrate for additional acceleration of said accelerated ions up to energy, which is sufficient for variation of the properties of said material on said substrate; additionally there is a plurality of controlled switchboards, each electrically connected to the said voltage source and electrically wired between the said voltage source and each of said second electrode from the said plurality of said pairs for selective regulation of electric voltage in each said aperture of said plurality of apertures and, correspondingly, for the controlled passing of said ions in each said aperture to the said substrate.

Due to the invention it became possible to generate on the substrate in a rapid regime with practically no distortion the needed image, including the image elements of micron and submicron size.

According to the invention it's useful to arrange all apertures of the said plurality of apertures regularly in the said mask one after another at the distance not more than a difference between the cross-section projection of said aperture produced by said accelerated ions on the said substrate and the cross-section of said aperture itself.

For removal from the said mask with parallel flat surfaces of excess charge accumulated during operation of ion source it is expedient to use a layer of conducting material on the said mask surface facing to said ion source.

According to the invention it's advisable that the material of said layer capable of changing its properties under the influence of said accelerated ions of said ion beam contains at least diatomic composition, which consists of separate atoms of oxygen, hydrogen, nitrogen, fluorine, carbon or of their combinations, or contains organic compound, or contains photosensitive compound, or contains thermosensitive compound.

According to the invention it's useful that each said first electrode is placed opposite to each said second electrode in each of said plurality of said apertures, which makes it possible to produce in each aperture an electric field with absolutely no influence on passing the accelerated ions through other apertures.

According to the invention for generating a said image in the form of multilayer structure it's useful to have in said chamber a tool, which provides an ion-stimulated deposition on said substrate of the upper layer of at least single-atomic compound, and/or a tool for reactive ion etching of the upper layer on said substrate, and/or a tool for physical sputtering of the said substrate, and/or a tool for ion coating of the upper layer on said substrate.

DETAILED DESCRIPTION

Figure 1:
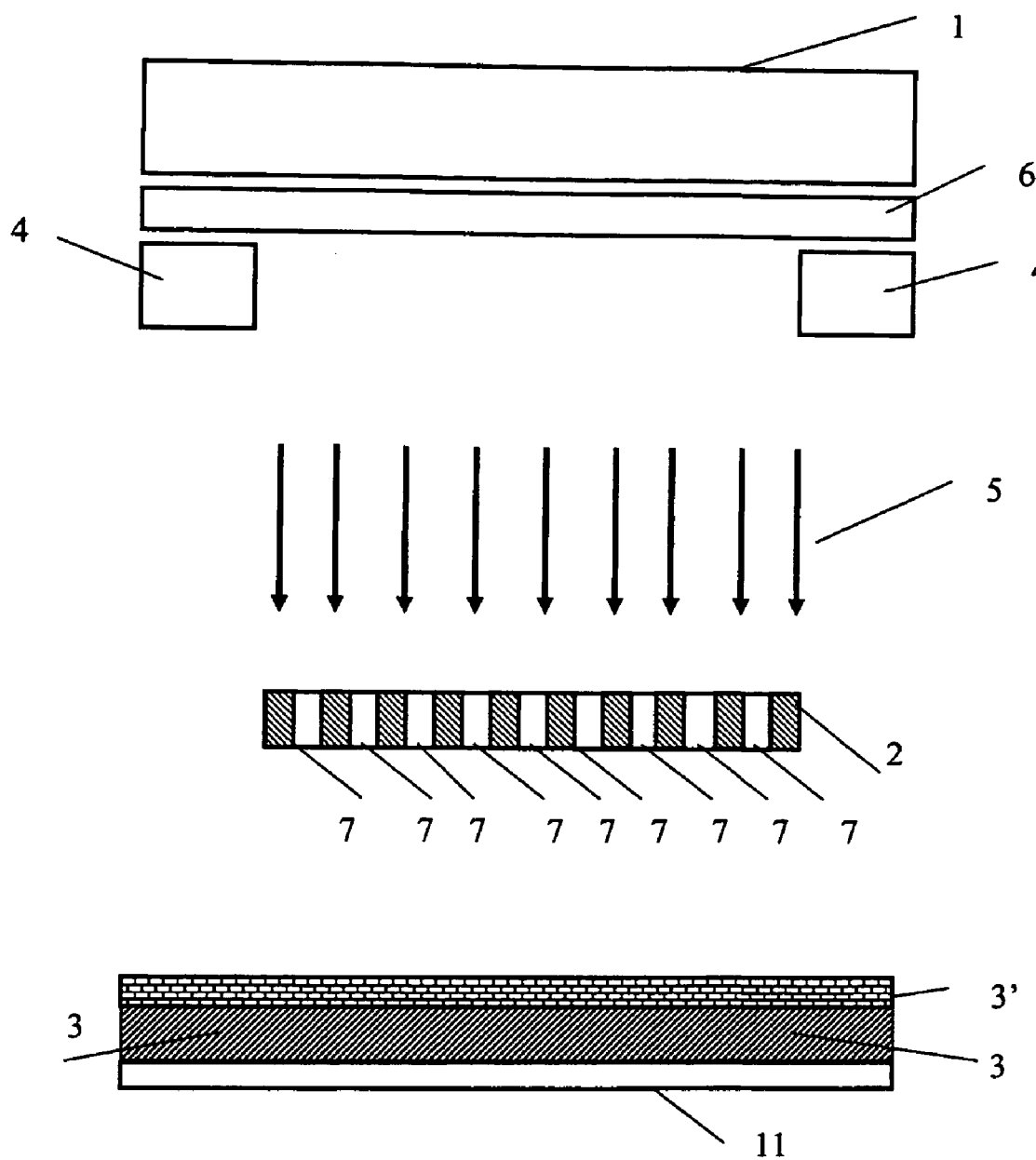
FIG. 1—is a schematic sketch of the ion printer circuit diagram made according to the invention, FIG. 2, 3, 4—show the versions of arrangement in the mask's apertures of a tool for regulation of the passing of accelerated ions on substrate according to the invention (longitudinal section), FIG. 5—is a variant of the mask implementation according to the invention (cross section).

The proposed ion printer consists of the following main coaxial parts: an ion source 1 (FIG. 1), a mask 2 with parallel flat surfaces, and substrate 3 for receiving said ions and for generating given image. All these parts are placed in a chamber with vacuum pumping facilities, at that according to the invention:

the said ion source 1 is selected from the know ones, and has a tool 4 for ion beam 5 forming with divergence angle $\leq 20°$ and a first tool 6 of acceleration of said ions in said ion beam, which according to invention provides to said ions of the said beam 5 the energy less than needed for variation of the properties of material on surface of said substrate 3;

a fixed substrate 3 has on its surface facing to said ion source 1 a layer 3' of material capable of changing its properties under the influence of said accelerated ions of said ion beam 5, including modification of its chemical composition and/or its colour. At that the said material can contain at least diatomic composition, which consists of separate atoms of oxygen, hydrogen, nitrogen, fluorine, carbon or of their combinations, or it can contain an organic compound, or it can contain a photosensitive compound, or it can contain a thermosensitive compound.

As a substrate 3 for image generation by spatially modulated ion beam 5 an image fixing mean should be used, that is selected from the known ones. For example, it can be matrix detector of charge particles like iconoscope or image multiplier orthicon, as well as various materials capable of irreversible modification of theirs properties under the influence of charged particles. As material of said layer 3' the photosensitive materials can also be used but they need subsequent processing and their resolution is usually not adequate (aside from those used in electron beam lithography). The most promising are the materials capable of changing their chemical composition under the influence of charged particle beam. This allows generating of the images—functional elements with different properties, e.g. conducting pattern in dielectric matrix, or image from magnetic elements in nonmagnetic matrix, or optically opaque pattern in optically transparent matrix, or pattern of carbon atoms in organic materials.

In the said chamber a mask 2 is placed with parallel flat surfaces and with plurality of apertures 7 for spatial modulation of ion beam 5 and for passing said ions to the said substrate 3. The said apertures 7 can have cross-section in the form of oval, circle, rectangle, square, and hexagon, etc.

The said mask 2 is placed between said ion source 1 and said substrate 3.

According to the invention the ratio of thickness of said mask 2 to distance from the said mask 2 to the said substrate 3 equals to 1/(0.6–3), correspondingly.

The said mask 2 with parallel flat surfaces is manufactured from any adequate material, which can be used in vacuum dependent upon ion irradiation.

Figure 2:
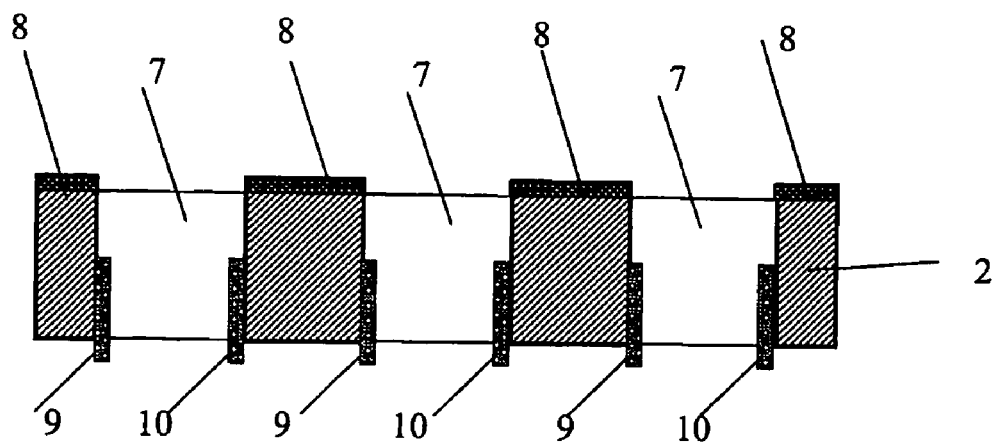
Figure 3:
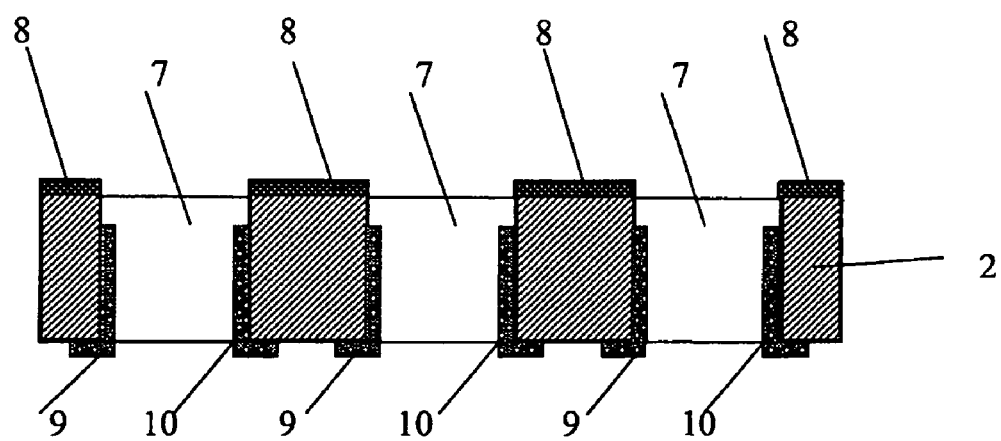

According to the invention the said mask 2 with parallel flat surfaces can be covered (on the surface facing the said ion source 1) by a layer 8 (FIG. 2) of conducting material, which excludes an accumulation of excess charge on the surface of the mask 2.

Each of the said plurality of apertures 7 in the said mask 2 arranged regularly one after another at the distance not more than a difference between the cross-section projection of said aperture 7 produced by said accelerated ions of said beam 5 (FIG. 1) on the said substrate 3 and the cross-section of said aperture 7 itself. This condition ensures generating of continuous images (lines) through the said mask 2 with discrete apertures 7. Moreover it's possible to use the total intensity of said ion beam 5 in the space between projections of the apertures 7 of mask 2 on substrate 3 (image fixing mean) for generating images in said spaces due to the same effects by variation the material properties directly under the apertures 7 of the mask 2. Finally it allows generating of continuous line images including those of micron and submicron width. At that, according to the invention a said apertures 7, produced in the mask 2 with parallel flat surfaces, are arranged regularly one after another at the distance not more than a difference between the cross-section projection of said aperture 7 produced by said accelerated ions of the beam 5 (FIG. 1) on the said substrate 3, and the cross-section of said aperture 7 itself. Execution of this condition provides creating of the continuous images (lines) by means of the mask 2 with discrete apertures 7. At that it's possible to use the total intensity of ion beam 5 in the areas between the projections of apertures 7 of mask 2 on substrate 3 (on the image fixing mean) for generating images in said areas due to the same effects leading to variation of the material's properties directly under the apertures 7 of the mask 2. Finally it's allows generating images of continuous lines, including those of micron and submicron width.

At that according to the invention each aperture 7 from said plurality of apertures has a ratio of its depth to its cross-section size in the range from 9 to 50.

Figure 5:
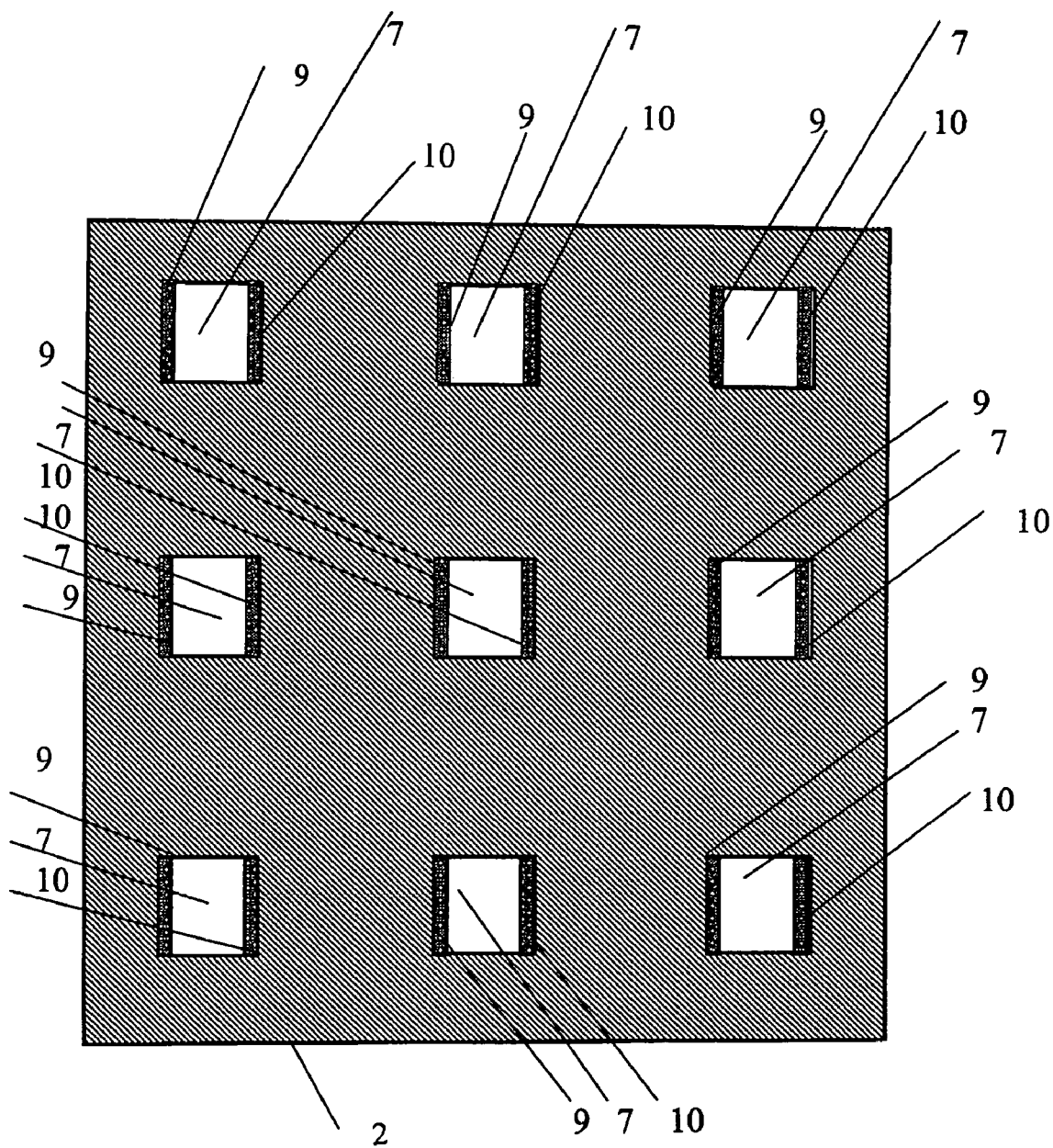

Each aperture 7 of the said plurality of apertures has a pair of the first electrode 9 (FIG. 2) and the second electrode 10, at that each of said pairs of electrodes acts as a said tool for regulation of the passing of said accelerated ions to the said substrate 3. Each first electrode 9 (FIG. 5) of said pair of electrodes is mainly placed inside each aperture 7 opposite to each said second electrode 10 of said pair of electrodes.

The said apertures 7 are arranged in the mask 2 as close as possible to each other reasoning from the used electric voltage at the electrodes 9, 10 inside the aperture 7.

Figure 4:
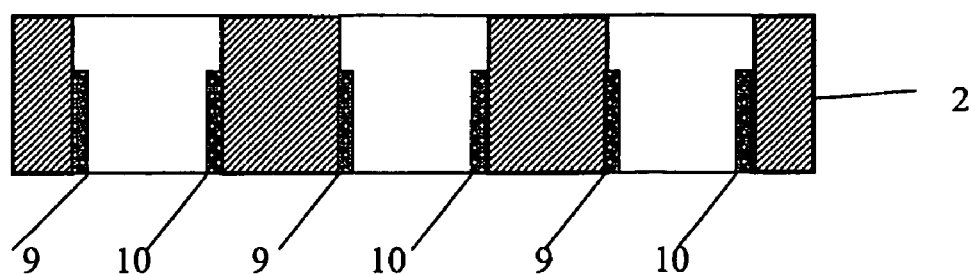

According to the invention the said electrodes 9, 10 (FIG. 2, 3) can go beyond the apertures 7 or electrodes 9, 10 (FIG. 4) do not go beyond the apertures 7 under the bottom surface of the mask 2.

Arranging the accelerated ion source 1 (FIG. 1) inside the ion printer chamber allows forming on the substrate 3 of the image by ion beam 5 with divergence angle $\leq 20°$.

The divergence angle of ion beam 5 of $\leq 20°$ allows diminishing noticeably a shady effect, i.e. preventing of unwanted increase of the aperture's 7 cross-section projection on substrate 3 produced by ion beam 5 passed through a single aperture 7.

It allows in turn arranging the spots (projections), which form the image, with higher areal density, i.e. to increase the resolution of generated image. For example, the usual calculations in the frames of ray optics show that in the case when accelerated ion beam 5 has divergence angle of 3° it's possible to diminish shady effect (broadening of the aperture's 7 cross-section projection on substrate 3) to the level of about 0.2 μm for the distance of 20 μm between the mask 2 and substrate 3. Moreover if accelerated ion beam 5 has divergence angle of 3° it's possible to obtain the ratio of intensities of ion beam 5 at the mask 2 aperture's 7 input to that at its output of about 1.5–2 (for aperture's aspect ratio of 50).

The claimed ion printer contains in said chamber a second tool 11 of acceleration of said ions placed under the said substrate 3 for additional acceleration of said accelerated ions in the space between the mask 2 and substrate 3 up to the energy required for variation of the properties of the said material on the said substrate 3 and for generating the various types of images.

The placement of the said second tool 11 of acceleration of ions under the substrate 3 where the image generates allows solving three problems.

First, it allows using the accelerated ion beam 5 with energies low enough to prevent physical sputtering of the material of said mask 2, which ensures the stability of its apertures 7 sizes and increases its service life.

Second, it allows decreasing the mask 2 heating by ion beam 5.

Third, it allows regulating of the ion beam 5 passing (including a total blocking) through the mask 2 apertures 7. At that the neutral atoms, which are formed as result of interaction of the ions accelerated by first acceleration tool 6 with electrodes 9, 10 and reach surface layer 3' of substrate 3 after scattering, do not generate an image, since their energy is below the value needed for variation the properties of the layer's 3' material.

Finally, in this case it's possible to provide an additional acceleration of ions after passing the apertures 7 in the mask 2 and to increase their energy up to the level needed for variation the properties of the layer's 3' material, i.e. that needed for implementation of the used image generation processes (like selective removal of atoms, ion-induced deposition, reactive ion etching, physical sputtering etc.).

The claimed ion printer contains an electric voltage source (not shown in the Figures) connected to each said first electrode 9 and to each said second electrode 10.

The claimed ion printer contains a plurality of controlled switchboards (not shown in the Figures), each electrically connected to the said voltage source and placed between the said voltage source and each of the said second electrodes 10 for selective regulation of electric voltage in each said aperture 7 and, correspondingly, for the controlled passing of said ions through each said aperture 7 to the said substrate 3.

According to the invention in the claimed ion printer one of the electrodes (the first one—9) of each said pair of electrodes is connected to voltage source through a common bus. The second electrode 10 of each said pair is connected to another pole of voltage source or to regulating device through a controlled switchboard. Voltage source, regulating device and controlled switchboard are selected from the known ones. A controlled switchboard can be operated from a personal computer (PC) supplied with corresponding software.

Connection of second electrode 10 of each said pair of electrodes to voltage source through controlled switchboard allows changing the generated image configuration without changing the mask 2, since in this case the functioning of each aperture 7 in the mask 2 can be controlled simultaneously and independently.

At that, the arrangement of said first 9 and second 10 electrodes (FIG. 5) at the wall of each aperture 7 opposite each other allows producing electric field oriented perpendicular to ion velocity vector. Since the electrodes are placed inside the apertures 7, this electric field doesn't influence at all the ion passing through other apertures 7. Correspondingly, if there is no voltage at some electrodes a part of ions (according to ray optics laws) will freely pass through those apertures 7. Due to second ion acceleration tool 11 (FIG. 1) those ions will get energy sufficient for variation the properties and chemical composition of surface layer 3' material on substrate 3.

If there are no voltage at all the electrodes the whole accelerated ion beam 5 would freely pass through all the apertures 7 and would generate an image including all the elements. If there is a voltage on some electrodes 9, 10 pairs and its value is determined by calculation or experimentally depending on the ion type, mass and energy as well as on the mask 2 thickness, the ion beams 5 inside those apertures 7 would be deflected to one of the electrodes, and after hitting it the ions will transform into neutral atoms and scatter. Even passing the aperture 7 and falling on the layer 3' of material on the surface of substrate 3 they will not change the properties of material of layer 3' and its chemical composition, since the neutral atoms will not be accelerated by second acceleration tool 11 up to the needed energy. Thus by appropriate selection of the apertures 7 to be closed for passing of the accelerated ions any image configuration could be obtained composed of elements repeating the shape of opened apertures 7 in mask 2 (like that in liquid crystal display of calculator, which generates figure images composed of separate pixels).

One of each said pair of electrodes is connected to common bus attached to the pole of the said voltage source. It's advisable to make electrodes 9, 10 (FIG. 2, 3) going beyond the apertures 7. On the one hand it simplifies the preparing of electric wiring and on the other hand it makes longer the way of ions in electric field between the electrodes 9, 10. The latter allows diminishing the applied voltage needed for total deflection of the ion beam 5 to one of the electrodes 9, 10, i.e. helps to avoid the electric breakthrough.

In some cases the surface of the said mask 2 facing to said ion source 1 contains a layer 8 of conducting material, which has no contact with electrodes 9, 10 and grounded. It allows removing the charge from the surface of mask 2 accumulated during the ion source 1 (FIG. 1) operation. At short (pulse) expositions and at high energies of accelerated ions the influence of this accumulated charge is not so noticeable, but at long expositions the said accumulated on the mask 2 surface charge would hamper the operation of ion printer to the extent when the ions are not able to pass through the apertures 7 even if no voltage is applied to the electrodes 9, 10 in those apertures 7.

According to the invention ion printer can contain in the said chamber a tool, which provides an ion-stimulated deposition on the said layer 3' on substrate 3 of at least single-atomic compound, and/or a tool for reactive ion etching of the said layer 3' on said substrate 3, and/or a tool for physical sputtering of the said layer 3' on said substrate 3, and/or a tool for ion coating of the said layer 3' on said substrate, which allows extending the functional capabilities of the claimed ion printer and generating of the images with micron and submicron element size in the form of multilayer structure. For example, it will be possible to generate the images not only due to variation of the substrate properties, but also due to deposition of other compounds with the properties different compared to those of substrate's 3 material, or due to partial removal of material from the substrate 3 surface.

The latter makes it possible to generate multilayer structures with three-dimensional pattern and with perfect matching of images (functional structures) in various layers, since all the layers of said multilayer structure will be formed through the same mask 2, which is fixed at immovable said substrate 3.

A tool for ion-stimulated deposition on the said layer 3' on said substrate 3 of at least single-atomic compound, a tool for reactive ion etching of the said layer 3' on said substrate 3, a tool for physical sputtering of the said layer 3' on said substrate 3, and a tool for ion coating of the said layer 3' on said substrate 3 can be selected from the known ones extensively used in production of microelectronic devices.

The claimed ion printer provides generating on the said layer 3' of said substrate 3 of the needed image, including the image elements of micron and submicron size in a rapid regime with practically no distortion.

The claimed ion printer operates in the following way.

The chamber containing an ion beam source 1 with a tool 4 for beam forming, first tool 6 of acceleration of ions, a mask 2 with parallel flat surfaces, and a substrate 3 with upper layer 3' for image fixing is pumped to needed vacuum ($10^{-4}$–$10^{-8}$ Torr), after that the ion source 1 is switched on.

The mask 2 (spatial modulator) is prepared from silicon wafer grinded to the thickness of 30 μm. There are two rows by 10 apertures 7 (1.5×6 μm) in the mask 2, the distance between any sides of nearest rectangles being 2 μm. The mask 2 is thermally oxidised with formation of 100 nm layer of silicon oxide on its surface. There is the 50 nm layer 8 of aluminium on the mask 2 surface facing the proton source 1, which provides a removal of accumulated charge.

On the long sides of cross-section of each aperture 7 (FIG. 4) two regulating metallic electrodes 9, 10 of 50 nm thickness are arranged that go beyond the mask 2 surface (FIG. 2, 3) on the side opposite to proton source 1 (FIG. 1). A common metallic bus is wired through a controlled switchboard to each first electrode 9 (FIG. 2, 3) in each aperture 7 and all the second electrodes 10 are wired to independent contact pads on the mask 2 that are connected through a switchboard to the 6 V voltage source.

The substrate 3 (FIG. 1) for the image fixing represents a glass plate of 0.5 mm thickness with cobalt oxide layer 3' of 50 nm thickness on its surface. This substrate 3 is placed on the second tool 11 of acceleration of the ions. The distance between upper surface of the layer 3' and bottom surface of the mask 2 equals to 20 µm.

Before switching on the proton source 1 the voltage is applied through a switchboard to the beforehand selected pairs of electrodes 9, 10 by connecting the common bus to one of the voltage source poles and one of the selected pair of electrodes 9, 10 in each aperture 7, which should be closed for proton beam at generation of the needed image—to the second pole. As a result the ions accelerated by tool 6 up to the energy less than needed for variation the properties of layer 3' from cobalt oxide and passing those apertures 7, where a voltage is applied to electrodes 9, 10, deflect on one of the aperture 7 walls, neutralize and transform into neutral atoms (provided that the selected voltage value ensures a total deflection of all the ions entering the aperture 7 on one of the electrodes 9, 10). As a result the atoms scattered in the direction of substrate 3 will not get additional energy from the second ion acceleration tool 11, which would be enough for variation of the chemical composition and properties of the layer 3' from cobalt oxide.

Thus an image is generated in the layer 3' on substrate 3 surface, which is composed of areas irradiated by accelerated ions that got an additional acceleration from the second ion acceleration tool 11. The substrate 3 fixes the image due to processes caused by the interaction of its surface layer 3' material with ions accelerated by second tool 11. At that the image is generated consisted of arbitrary number of areas (pixels). The number of pixels in generated images depends on the number and areal density of apertures 7 in the mask 2 as well as on sizes of the mask 2 and on the ion beam 5 characteristics.

Ion printer, which operation is described, includes proton source 1 with a total beam divergence angle—10°, beam diameter—2 cm, and beam current—2 mA. The first tool 6 of acceleration provides the energy of proton beam 5 falling on the mask 2 with parallel flat surfaces about 300 eV, which is below the threshold sputtering value for the material of the mask 2 and less than the energy needed for variation the properties of the layer 3' material.

The voltage of 1200 V is applied to the second tool 11 of acceleration, thus the total energy of protons falling on substrate 3 equals to 1500 V. After the proton source 1 is switched on the selective removal of oxygen atoms from the cobalt oxide starts in the surface layer 3' of substrate 3 areas opposite to the apertures 7 in the mask 2, which don't connected to switchboard, and in 10 min metallic cobalt appears on these areas. At the same time no layer 3' material (cobalt oxide) modification occurs in the areas opposite to the apertures 7 in the mask 2 with both electrodes 9, 10 connected to 6 V voltage source through a switchboard, since the proton beam 5 doesn't pass through those apertures 7 being totally deflected to their electrodes 9,10 connected to negative pole of the voltage source. Due to interaction with negatively charged electrodes the protons are neutralized and scatter. The scattered neutral atoms even falling on substrate 3 surface do not have sufficient energy to produce any variations in the layer 3' material on substrate 3.

As a result the pattern composed of metallic rectangles of 2.5×6.5 µm is generated on the surface of insulating cobalt oxide film and those rectangles represent the single-domain magnetic bits of cobalt in nonmagnetic matrix of cobalt oxide.

Operation of the claimed ion printer can be also demonstrated by the example of krypton ion beam (ion energy—50 eV, ion current—1.5 mA, beam diameter—2 cm) irradiating the layer 3' for image fixing on substrate 3 (aluminium film of 100 nm thickness or tungsten oxide film of the same thickness deposited on the 0.5 mm glass plate), the distance between upper surface of the layer 3' and bottom surface of the mask 2 being 10 µm. After additional acceleration the energy of krypton ions falling on substrate is equal to 1400 V.

The relief image composed of rectangle hollows is generated on the areas of layer 3' irradiated by krypton ions due to physical sputtering of aluminium (tungsten oxide) 50 nm deep (for aluminium) and 30 nm deep (for tungsten oxide).

Operation of the claimed ion printer can be also demonstrated by the example of filling sulphur hexafluoride ($SF_6$) into the space between mask 2 and substrate 3 from a separate balloon. As a layer 3' for image fixing the silicon oxide film of 400 nm thickness is used prepared by thermal oxidation of 0.4 mm silicon wafer. The distance between upper surface of the layer 3' and bottom surface of the mask 2 equals to 50 µm.

After additional acceleration the energy of protons falling on substrate 3 makes 1200 V. Due to sulphur hexafluoride leakage the residual pressure in the chamber increases from $10^{-8}$ up to $10^{-4}$ Torr. Under the influence of proton irradiation a decomposition of the sulphur hexafluoride molecules and the corresponding reactive ion etching of silicon oxide 200 nm deep occurs at the substrate 3 areas opposite to the apertures 7 of mask 2 opened for proton beam 5 passing. As a result the relief image composed of rectangle hollows is generated on the silicon oxide film areas opposite to the apertures 7 of mask 2 opened for accelerated proton beam passing, which can be observed in optic microscope.

Operation of the claimed ion printer can be also demonstrated by the example of filling tungsten hexafluoride ($WF_6$) into the space between mask 2 and substrate 3 from a separate balloon. The proton beam 5 is used with energy—100 eV, beam current—1 mA and beam diameter—2 cm. As substrate 3 for image fixing the silicon wafer of 0.4 mm thickness is used. The distance between upper surface of the substrate 3 and bottom surface of the mask 2 equals to 40 µm.

After additional acceleration the energy of protons falling on substrate 3 equals to 1500 V. Due to tungsten hexafluoride leakage the residual pressure in the chamber increases from $10^{-8}$ up to $10^{-5}$ Torr. Under the influence of proton irradiation a decomposition of the tungsten hexafluoride molecules and corresponding ion-induced deposition of 200 nm tungsten film occurs on the substrate 3 areas opposite to the apertures 7 of mask 2 opened for proton beam 5 passing. As a result the relief image composed of rectangle metallic lugs is generated on the substrate 3 surface areas opposite to the mask 2 apertures 7 opened for proton beam 5 passing.

Operation of the claimed ion printer can be also demonstrated by the example of the proton beam's 5 energy falling on the mask—200 eV, beam current—2 mA and beam diameter—2 cm. As substrate 3 for image fixing the silicon oxide film of 300 nm thickness is used prepared by thermal oxidation of 0.4 mm silicon wafer.

At the first step the relief image of 200 nm deep is generated on substrate 3 due to leakage of sulphur hexafluoride in the space between the mask 2 and the substrate 3 and the corresponding proton induced reactive ion etching. This image is generated under all the even apertures 7 of the mask 2 in both rows.

At the second step the tungsten hexafluoride is introduced in the system, which is decomposed by proton beam 5 passing through the same even apertures 7 of the mask 2 resulting in the ion-stimulated deposition of 200 nm thick tungsten film in the hollows previously prepared by reactive ion etching in silicon oxide layer.

After that a continuous 200 nm thick layer of silicon oxide is ion deposited on the obtained structure and its reactive ion etching is performed in the areas over the previously prepared vertical tungsten wires, which leads to formation of through channels in silicon oxide down to metallic tungsten.

The next step consists in ion deposition of continuous molybdenum oxide layer of 50 nm thickness.

Then all the apertures in mask 2 become opened by the tool of regulation of the ion passing (namely by electrodes 9, 10) and due to selective removal of oxygen atoms the two continuous parallel lines of metallic molybdenum (horizontal wires) are generated that are perfectly matched and have the electric contacts with the vertical tungsten wires in the bottom layer.

As a result a three-layer functional structure with perfect matching of the elements in various layers is prepared through the same fixed mask 2 and substrate 3 for image fixing.

The claimed ion printer provides: the decrease of minimal element size of the generated images to the micron and submicron range; increases the passing capability of each aperture of the mask with parallel flat surfaces in the ion beam transparent regime; a possibility of simultaneous and independent regulation of passing the ion beam through all the apertures of the mask; a possibility of preparation the multilayer images (functional structures) without mutual displacement of the mask relative to the image fixing substrate; a possibility of generating the continuous images (lines) through the mask with a set of discrete apertures.

The invention claimed is:

1. An ion printer for simultaneous generation on the spatially fixed substrate of the whole image consisting of micron and submicron size elements, which contains in the chamber with vacuum pumping facilities the following coaxial parts:
    an ion beam source with a tool for beam forming, which ensures the divergence angle less than 20°, and with the first tool of acceleration of said ions in the said ion beam;
    a fixed substrate, which has on its surface facing to said ion source a layer of material capable of changing its properties under the influence of said accelerated ions of said ion beam;
    a said first acceleration tool, which provides to said ions of said beam the energy less than the needed for variation of the properties of said material on said surface of said substrate;
    a mask with parallel flat surfaces and with plurality of apertures for passing said ions to the said substrate placed between said ion beam source and said substrate;
    a said mask with parallel flat surfaces with a ratio of its thickness to the distance from the said mask to the said substrate equals to 1:(0.6–3), correspondingly;
    a said each of the said plurality of apertures with the ratio of its depth to its cross-section size being in the range from 9 to 50;
    a said each of the said plurality of apertures containing a tool for regulation of the passing of the said ions;
    a plurality of pairs of the first electrode and the second electrode, acting as a said tool for regulation of the passing of said accelerated ions to the said substrate;
    each pair of electrodes from the said plurality of pairs, placed in a said each of said plurality of said apertures;
    a second tool of acceleration of said ions placed under the said substrate for additional acceleration of said accelerated ions up to the energy required for variation of the properties of the said material on the said substrate;
    an electric voltage source connected to each said first electrode and to each said second electrode of each of plurality of said pairs;
    a plurality of controlled switchboards, each electrically connected to the said voltage source and placed between the said voltage source and each of the said second electrode from the said plurality of said pairs for selective regulation of electric voltage in each said aperture of said plurality of apertures and, correspondingly, for the controlled passing of said ions in each said apertures to the said substrate.

2. The ion printer of claim 1 wherein each of the said plurality of apertures arranged regularly one after another in the said mask at the distance not more than a difference between the cross-section projection of said aperture produced by said accelerated ions on the said substrate and the cross-section of said aperture itself.

3. The ion printer of claim 1 wherein the said mask has on its said surface facing to said ion source a layer of electrically conducting material.

4. The ion printer of claim 1 wherein the material of said layer, capable of changing its properties under the influence of said accelerated ions of said ion beam, contains at least diatomic composition, which consists of separate atoms of oxygen, hydrogen, nitrogen, fluorine, carbon or of their combinations.

5. The ion printer of claim 1 wherein the material of said layer, capable of changing its properties under the influence of said accelerated ions of said ion beam, contains organic compound.

6. The ion printer of claim 1 wherein the material of said layer, capable of changing its properties under the influence of said accelerated ions of said ion beam, contains photosensitive compound.

7. The ion printer of claim 1 wherein the material of said layer, capable of changing its properties under the influence of said accelerated ions of said ion beam, contains thermosensitive compound.

8. The ion printer of claim 1 wherein each said first electrode is placed opposite to each said second electrode in each said plurality of said through channels.

9. The ion printer of claim 1 wherein in the said chamber there is a tool, which provides an ion-stimulated deposition on the said upper layer of substrate of at least single-atomic compound, and/or a tool for reactive ion etching of the said upper layer of substrate, and/or a tool for physical sputtering of the said upper layer of substrate, and/or a tool for ion coating of the said upper layer of substrate.

* * * * *